United States Patent [19]
Itoh et al.

[11] Patent Number: 5,715,286
[45] Date of Patent: Feb. 3, 1998

[54] DIGITAL PHASE SYNCHRONOUS CIRCUIT AND DATA RECEIVING CIRCUIT INCLUDING THE SAME

[75] Inventors: Masaaki Itoh; Yoshinori Rokugo, both of Tokyo, Japan

[73] Assignee: NEC Corporation, Japan

[21] Appl. No.: 655,983

[22] Filed: May 31, 1996

[30] Foreign Application Priority Data

May 31, 1995 [JP] Japan .................. 7-132490

[51] Int. Cl.$^6$ ................................ H03D 3/24
[52] U.S. Cl. .......................... 375/376; 331/1 R
[58] Field of Search ...................... 375/376, 374, 375/377; 331/1 A, 1 R, 10, 17, 18, 25, 34; 327/3, 16, 17, 20, 141, 145, 147, 151, 155, 164, 165, 166, 172, 175

[56] References Cited

U.S. PATENT DOCUMENTS 4,791,386 12/1988 Shiga ........................ 331/1 A
5,057,794 10/1991 Shih ........................... 331/1 A
5,488,641 1/1996 Ozkan ........................ 375/374
5,577,080 11/1996 Sakaue et al. ............... 375/376

FOREIGN PATENT DOCUMENTS

62-154929  7/1987  Japan .

*Primary Examiner*—Stephen Chin
*Assistant Examiner*—Joseph Roundtree
*Attorney, Agent, or Firm*—Ostrolenk, Faber, Gerb & Soffen, LLP

[57] ABSTRACT

A digital phase synchronous circuit includes a phase comparing circuit for outputting a count value according to the result of a phase comparison between an output signal and an externally input reference signal; a frequency regulating circuit for inputting an oscillation signal with a predetermined repetition frequency and controlling the repetition frequency according to the count value to output it as the output signal; and a controlling circuit for controlling the frequency regulating circuit to output the oscillation signal with the predetermined repetition frequency when the input of the reference signal breaks down.

16 Claims, 5 Drawing Sheets

DIGITAL PHASE SYNCHRONOUS CIRCUIT AND DATA RECEIVING CIRCUIT INCLUDING THE SAME

FIELD OF THE INVENTION

This invention relates to a digital phase synchronous circuit and, more particularly, to a complete secondary DPLL(digital phase-locked loop) which is used for stuff-synchronizing in a SDH(synchronous digital hierarchy) network, and a data receiving circuit including the same.

BACKGROUND OF THE INVENTION

In the SDH network, to regulate the frequency of a high-speed side signal, a pointer operation which uses byte stuffing has been employed. Namely, a stuff pulse is stuffed on a data transmitting side and the stuffed pulse is destuffed on a data receiving side. The transmitted data is temporarily memorized in a memory on the data receiving side and then is read out by the low-speed side signal on the data receiving side.

In the pointer operation, a phase gap may have occurred as the result of the byte stuffing. Therefore, to obtain a low-speed side clock signal from a high-speed side clock signal, the phase gap caused by the pointer operation, i.e., stuffing and destuffing of the stuff pulse, needs to be suppressed. Thus, the low-speed side clock signal in which the phase gap is suppressed is used to read out data from the memory.

In general, when data is read out from a memory, an analog PLL(phase-locked loop) is typically used. However, when a signal with a phase gap is input to the PLL, a phase error occurs when comparing it with an output signal with no phase gap. To reduce the phase error, a data receiving circuit which employs a complete secondary DPLL is suggested.

The complete secondary DPLL generally comprises a primary loop which includes a frequency regulator for increasing or decreasing a pulse to or from a reference clock signal which is an oscillation signal with a predetermined repetition frequency, an R frequency divider for dividing the frequency of the frequency-regulated reference clock signal by R to output it as a low-speed side clock signal, N frequency dividers for dividing the frequencies of a high-speed side clock signal and the low-speed side clock signal, respectively by N, a multi-valued phase comparator for comparing the phases output from the N frequency dividers to output a leading phase pulse which represents how many phase leads to a phase difference 180° and a lagging phase pulse which represents how many phase lags to a phase difference 180°, a primary random walk filter for dividing the difference between pulse numbers of the leading phase and lagging phase output from the multi-valued phase comparator by N1, and an adder-subtracter circuit for providing the frequency regulator with a control pulse.

In addition, the complete secondary DPLL further comprises a secondary loop which includes a secondary random walk filter for dividing a pulse number output from the primary random walk filter by N2, a Q counter for storing the output of the secondary random walk filter, a rate multiplier for producing some increment pulses or decrement pulses according to the low-speed side clock signal and outputting a pulse corresponding to a central frequency of the system of the increment pulse and decrement pulse according to the value stored in the Q counter, and the adder-subtracter circuit for increasing or decreasing the output of the primary random walk filter and the output of the rate multiplier to provide the frequency regulator with a control pulse.

The conventional data receiving circuit which employs the complete secondary DPLL is characterized in that it operates with storing the central frequency of the system, i.e., a frequency in the lock state by the secondary loop and does not generate a stationary phase error when operating with storing the central frequency of the system. Here, the stationary phase error is generated to lock the PLL to a frequency of the high-speed side clock signal when the frequency of the high-speed side clock signal is shifted from the frequency of the reference clock signal of the PLL and when the control pulse is added to the frequency regulator by the primary loop. However, when it operates with storing the central frequency of the system, the stationary phase error by the primary loop is not generated since the secondary loop adds the control pulse to the frequency regulator. A similar DPLL is disclosed in Japanese patent application laid-open No. 62-154929.

However, in the conventional data receiving circuit which employs the complete secondary DPLL, when the high-speed side clock signal breaks down, the multi-valued phase comparator does not conduct a correct comparison between the output signals from the N frequency dividers and outputs a false control pulse. In the primary loop, the false control pulse is input to the frequency regulator through the primary random walk filter. In the secondary loop, the false control pulse is input to the Q counter through the primary random walk filter and secondary random walk filter.

Since the Q counter counts the output of the secondary random walk filter which is produced by the false control pulse and stores the counted value, the Q counter changes the stored count value corresponding to the central frequency of the system. Based on the false count value in the Q counter, the rate multiplier produces an increment pulse and a decrement pulse and outputs them to the frequency regulator. Thus, a free-run frequency of the DPLL generated in the frequency regulator from the reference clock signal and the control pulses of the primary and secondary loops may be shifted from the central frequency of the system.

As a result, the DPLL will output the false low-speed side transmission signal to the outside of the device since it operates with recognizing the shifted frequency as the central frequency of the system.

SUMMARY OF THE INVENTION

Accordingly, it is an object of the invention to provide a digital phase synchronous circuit in which a low-speed side clock signal with a correct frequency can be output without shifting the free-run frequency from a central frequency of the system when the high-speed side clock signal breaks down.

It is a further object of the invention to provide a data receiving circuit which employs such digital phase synchronous circuit.

According to the invention, a digital phase synchronous circuit, comprises:

phase comparing means for outputting a count value according to the result of a phase comparison between an output signal and an externally input reference signal;

frequency regulating means for inputting an oscillation signal with a predetermined repetition frequency and controlling the repetition frequency according to the count value to output it as the output signal; and controlling means for controlling the frequency regulating means to output the oscillation signal with the predetermined repetition frequency when the input of the reference signal breaks down.

According to another aspect of the invention, a data receiving circuit, comprises:

phase comparing means for outputting a count value according to the result of a phase comparison between an output signal and an externally input reference signal;

frequency regulating means for inputting an oscillation signal with a predetermined repetition frequency and controlling the repetition frequency according to the count value to output it as the output signal;

controlling means for controlling the frequency regulating means to output the oscillation signal with the predetermined repetition frequency when the input of the reference signal breaks down; and a memory for memorizing a receiving data by the reference signal;

wherein the data memorized in the memory is read out the output signal.

In accordance with the digital phase synchronous circuit of the invention, when the high-speed side clock signal has trouble, the high-speed side clock trouble detection circuit outputs the reset signal to the primary random walk filter, secondary random walk filter and Q counter to stop the pulse control to the reference clock signal in the frequency regulator. Thus, since a signal(free-run frequency signal) obtained by dividing the reference clock signal by R is output as the low-speed side clock signal, the trouble in the low-speed side clock signal can be prevented to correctly read out data from the memory.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a data receiving circuit in the preferred embodiment, the aforementioned conventional data receiving circuit device will be explained in FIG. 1.

Figure 1:
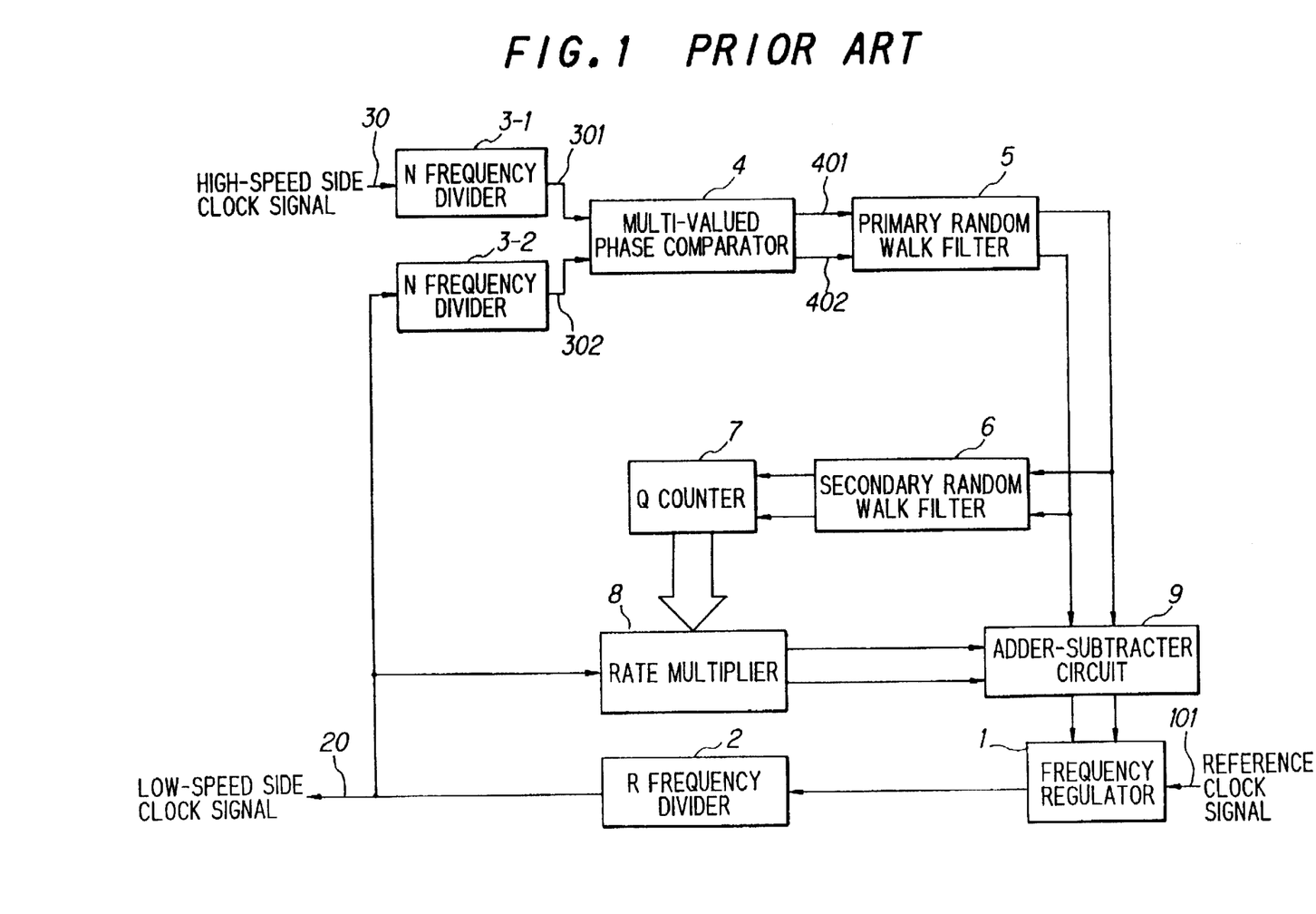
FIG. 1 is a block diagram showing a conventional data receiving circuit.

FIG. 1 shows a main part of a conventional data receiving circuit which employs a complete secondary DPLL (digital phase-locked loop). In the complete secondary DPLL, a high-speed side clock signal is used as a reference signal and a low-speed side clock signal is output to read out data of a memory (not shown). Herein, transmitted data is temporarily written in the memory of receiving side and then the written data is read out.

The complete secondary DPLL comprises a primary loop which includes a frequency regulator 1 for regulating a frequency by increasing or decreasing a pulse to or from a reference clock signal 101 which is an oscillation signal with a predetermined repetition frequency, a R frequency divider 2 for dividing the frequency of the frequency-regulated reference clock signal by R to output it as a low-speed side clock signal 20, N frequency dividers 3-1 and 3-2 for dividing the frequencies of a high-speed side clock signal 30 and the low-speed side clock signal 20, respectively by N, a multi-valued phase comparator 4 for comparing the phases output from the N frequency dividers 3-1 and 3-2 to output a leading phase pulse 401 which represents how many a phase leads to a phase difference 180° and a lagging phase pulse 402 which represents how many a phase lags to a phase difference 180°, a primary random walk filter 5 for dividing the difference between pulse numbers of the leading phase and lagging phase output from the multi-valued phase comparator 4 by N1, and an adder-subtracter circuit 9 for providing the frequency regulator 1 with a control pulse.

In addition, the complete secondary DPLL further comprises a secondary loop which includes a secondary random walk filter 6 for dividing a pulse number output from the primary random walk filter 5 by N2, a Q counter 7 for storing the output of the secondary random walk filer 6, a rate multiplier 8 for producing some increment pulses or decrement pulses according to the low-speed side clock signal 20 and outputting a pulse corresponding to a central frequency of the system of the increment pulse and decrement pulse according to the value stored in the Q counter 7, and the adder-subtracter circuit 9 for increasing or decreasing the output of the primary random walk filter 5 and the output of the rate multiplier 8 to provide the frequency regulator 1 with a control pulse.

Figure 2:
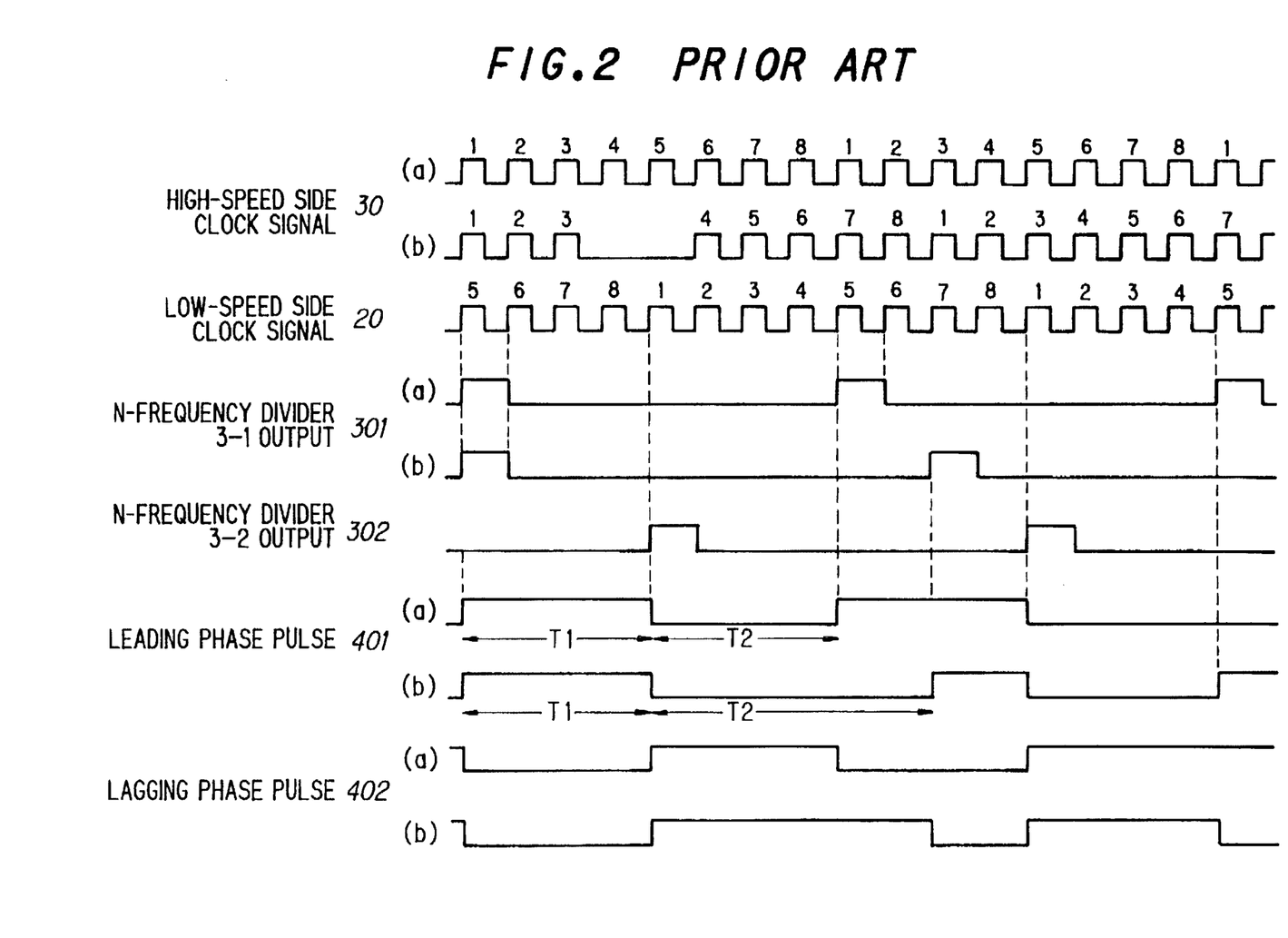
FIG. 2 shows waveforms in operation of the data receiving circuit in FIG. 1.

Referring to FIG. 2, the operation of DPLL shown in FIG. 1 will be explained below. FIG. 2 illustrates a high-speed side clock signal 30, low-speed side clock signal 20, output 301 of the N frequency divider 3-1, output 302 of the N frequency divider 3-2 and outputs 401 and 402 of the multi-valued phase comparator 4. Here, the value of N is eight for explanation. In FIG. 2, (a) represents an example of a waveform without partial lack of pulses, and (b) represents an example of a waveform with the partial lack of pulses due to the pulse stuffing.

As shown in FIG. 2, when the partial lack of pulses does not occur in the high-speed side clock signal 30, the output 301(a) is output from the N frequency divider 3-1 for dividing the high-speed side clock signal 30 by N. The output signal 301(a) has a pulse generated to every eight pulses of the high-speed side clock signal 30(a). The N frequency divider 3-2 operates by shifting its phase by 180° to the N frequency divider 3-1, and the output signal 302 has a pulse every eight pulses of the low-speed side clock signal 20 and has a phase shifted by 180° to the output 301(a).

Namely, when the phase difference between the high-speed side clock signal which is a clock signal for writing in a memory(not shown) and the low-speed side clock signal which is a clock signal for reading out from the memory is set at 180°, the writing and reading of the memory is alternately carried out. When the phase difference is 180°, both the leading phase pulse 401(a) and lagging phase pulse 402(a) from the multi-valued phase comparator 4 have a pulse duty ratio of 50%. Therefore, when the phase difference is 180°, T1 and T2 shown in FIG. 2 have the same value.

On the other hand, when the partial lack of pulses due to the pulse stuffing occurs in the high-speed side clock signal 30 as shown in 30(b) of FIG. 2, the output 301(b) of the N frequency divider 3-1 has a waveform in which a pulse appears on the position later than the regular position. The output 302 of the N frequency divider 3-2 has the same waveform as the above.

Therefore, in both the leading phase pulse 401(b) and lagging phase pulse 402(b) from the multi-valued phase comparator 4, T1 is not equal to T2 and a duty ratio of 50% is not obtained. Even in such case, in this DPLL, since the Q counter 7 in the secondary loop stores the count value at the phase synchronous state, the low-speed side clock signal 20 does not have partial lack of pulses even when the high-speed side clock signal 30 has the partial lack of pulses.

Figure 3:
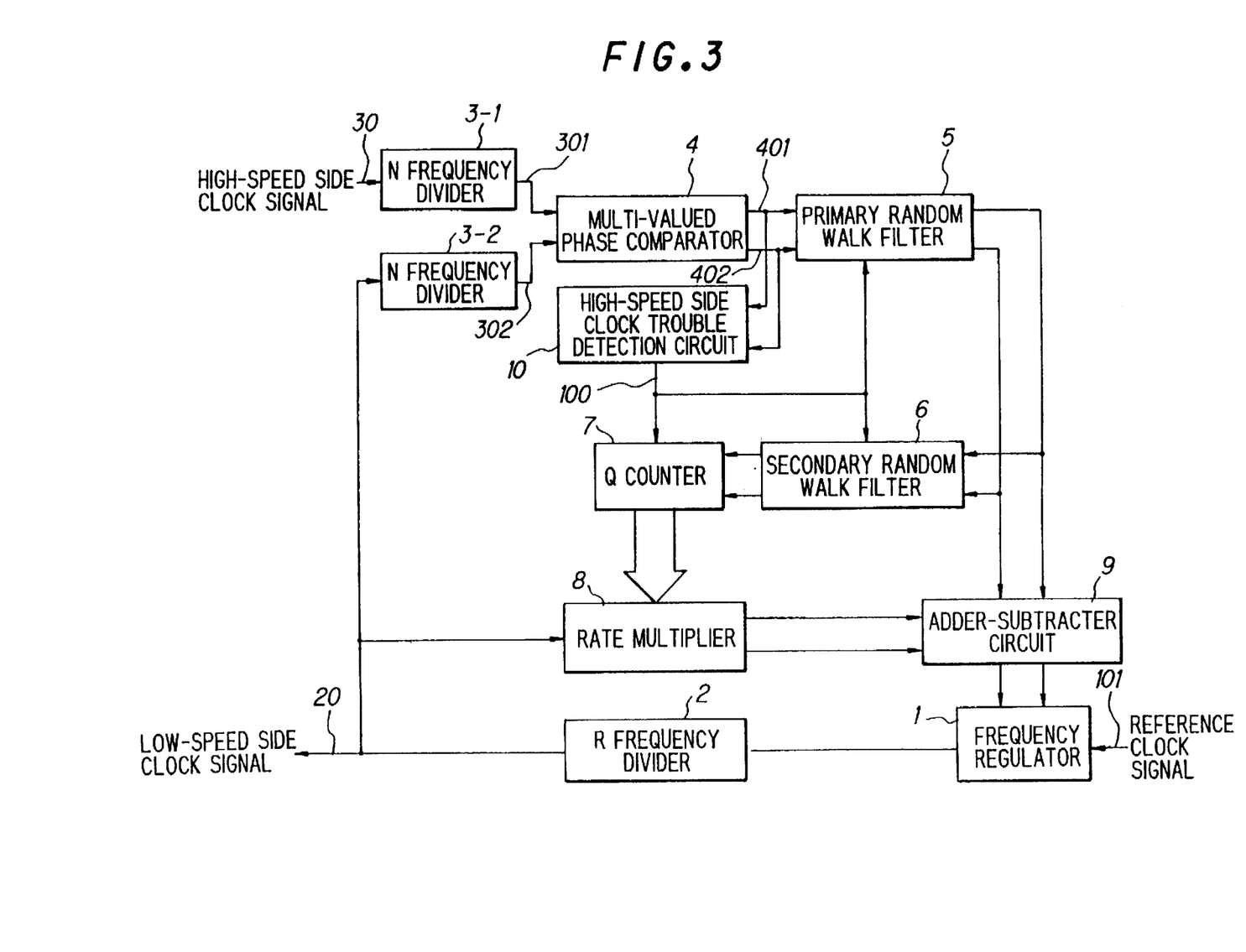
FIG. 3 is a block diagram showing a data receiving circuit in a preferred embodiment according to the invention.

Next, a data receiving circuit which employs a digital phase synchronous circuit in accord with the preferred embodiment of the invention will be explained with reference to FIG. 3, wherein like parts are indicated by like reference numerals as used in FIG. 1.

The data receiving circuit comprises a frequency regulator 1, a R frequency divider 2, N frequency dividers 3-1 and 3-2, a multi-valued phase comparator 4, a primary random walk filter 5, a secondary random walk filter 6, a Q counter 7, a rate multiplier 8, an adder-subtracter circuit 9 and a high-speed side clock trouble detection circuit 10.

Here, the frequency regulator 1, the R frequency divider 2, N frequency dividers 3-1 and 3-2, the multi-valued phase comparator 4, the primary random walk filter 5 and the adder-subtracter circuit 9 form a primary loop, and the secondary random walk filter 6, the Q counter 7, the rate multiplier 8 and the adder-subtracter circuit 9 form a secondary loop.

The frequency regulator 1 regulates the frequency by increasing or decreasing a pulse to or from a reference clock signal 101. The R frequency divider 2 divides the regulated reference clock signal 101 by R to output it as a low-speed side clock signal 20. The N frequency dividers 3-1 and 3-2 divides a high-speed side clock signal 30 and the low-speed side clock signal 20, respectively by N. The multi-valued phase comparator 4 compares the outputs from the N frequency dividers 3-1 and 3-2 to output a leading phase pulse 401 which represents how many the phase leads to a phase difference 180° and a lagging phase pulse 402 which represents how many the phase lags to a phase difference 180°.

The primary random walk filter 5 which is an up-down counter makes an up-count by the leading phase pulse 401 output from the multi-valued phase comparator 4 and makes a down-count by the lagging phase pulse 402. Then, the primary random walk filter 5 divides the difference between both the count numbers by N1 and outputs a control pulse to the frequency regulator 1. The control pulse includes two kinds of pulses, i.e., one is an increment pulse that the count value of the primary random walk filter 5 gives (in a positive, plus sense) and the other is a decrement pulse that the count value of the primary random walk filter 5 gives (in a negative, minus sense).

The secondary random walk filter 6 which is an up-down counter, similarly to the primary random walk filter 5, conducts the up/down-count of the control pulse from the primary random walk filter 5 and divides the difference between both the count numbers by N2.

The Q counter 7 counts the number of an increment pulse or decrement pulse output from the secondary random walk filter 6 and stores the counted number.

The rate multiplier 8 produces some increment pulses or decrement pulses the frequency of which is different from each other by the high-speed side clock signal 20. Then, it selects either of the increment pulse or decrement pulse according to the value stored in the Q counter 7 and controls the frequency regulator 1 by using it as the second increment pulse or decrement pulse which corresponds to the central frequency of the system.

The adder-subtracter circuit 9 conducts an increment or decrement operation between the increment pulse (hereinafter referred to as I1) or decrement pulse (hereinafter referred to as D1) output from the primary random walk filter 5 and the increment pulse (hereinafter referred to as I2) or decrement pulse (hereinafter referred to as D2) output from the rate multiplier 8. In a predetermined period, the adder-subtracter circuit 9 outputs two increment pulses when I1 and I2 appear, two decrement pulses when D1 and D2 appear, one increment pulse when I1 or I2 appears and one decrement pulse when D1 or D2 appears. When I1 and D2, I2 or D1 or I2 and D2 appears, none of the increment and decrement pulses is output.

The operation of the high-speed side clock trouble detection circuit 10 will be explained below. When the high-speed side clock signal 30 breaks down, the N frequency divider 3-1 continuously outputs "0" or "1". When the output of the N frequency divider 3-1 is "0", the multi-valued phase comparator 4 continuously outputs the leading phase pulse 401. When the output of the N frequency divider 3-1 is "1", the multi-valued phase comparator 4 continuously outputs the lagging phase pulse 402.

The high-speed side clock trouble detection circuit 10 accumulates the number of the leading phase pulse and lagging phase pulse and detects high-speed side clock trouble when the accumulated number exceeds a threshold. Then, it outputs a reset signal 100 to the primary random walk filter 5, secondary random walk filter 6 and Q counter 7 to reset them. By the reset signal 100, the output of the increment and decrement pulses from the primary random walk filter 5 and secondary random walk filter 6 is stopped and the count value of the Q counter 7 is reset.

Figure 4:
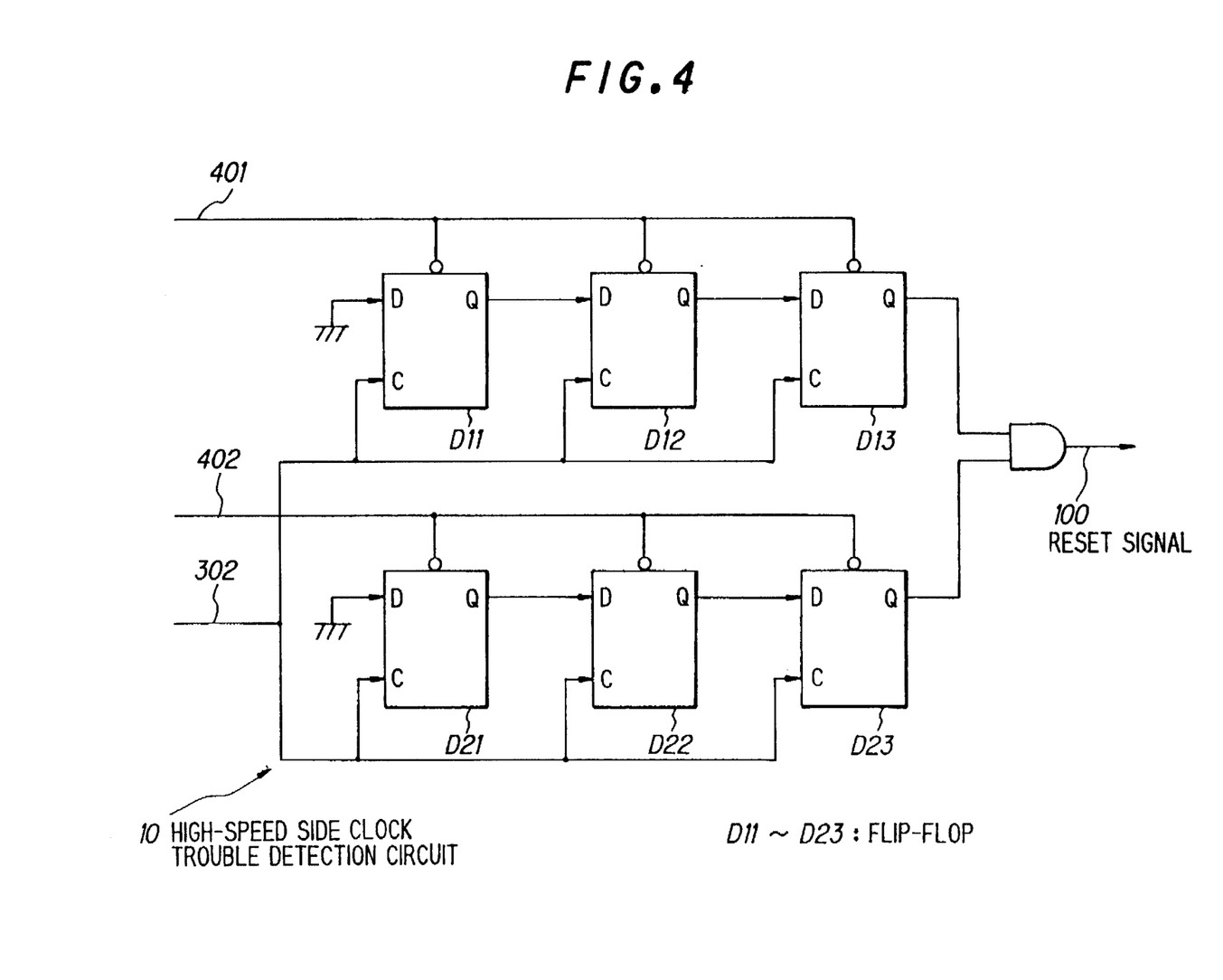
FIG. 4 is a circuit diagram showing the composition of a high-speed side clock trouble detection circuit in FIG. 3.

The detail composition of the high-speed side clock detection circuit 10 will be explained below. FIG. 4 shows an example of the high-speed side clock trouble detection circuit 10. As shown in FIG. 4, the high-speed side clock trouble detection circuit 10 comprises D-type flip-flops D11 to D13 which have ENABLE inputs of the leading phase pulse 401 and are triply cascaded, D-type flip-flops D21 to D23 which have ENABLE inputs of the leading phase pulse 402 and are triply cascaded, and an AND circuit which inputs an output Q from the flip-flop D13 and an output Q from the flip-flop D23. Here, each of the flip-flops operates using the output 302 of the N frequency divider 3-2 as a clock.

In the above composition, both the inputs of D11 and D21 which are the first-step flip-flops are "0" (ground level). Thus, to get the outputs Q of D13 and D23 of "0", three clocks are needed. As previously mentioned, when the high-speed side clock signal 30 breaks down, the N frequency divider 3-1 continuously outputs "0" or "1". When the output of the N frequency divider 3-1 is "0", the multi-valued phase comparator 4 continuously outputs the leading phase pulse 401. When the output of the N frequency divider 3-1 is "1", the multi-valued phase comparator 4 continuously outputs the lagging phase pulse 402.

Accordingly, when the high-speed side clock signal 30 breaks down, one of the flip-flops D11 to D13 and the flip-flops D21 to D23 takes an ENABLE state and the other takes a DISABLE state.

When it takes a DISABLE state, the output Q of the third-step flip-flop D13 or D23 retains a "1". When it takes an ENABLE state, three clocks are needed so that the input D of the first-step flip-flop D11 or D21 of "0" can be output as the output Q of the third-step flip-flop D13 or D23. Namely, just when the third clock is input, the detection circuit 10 operates as a digital monostable multivibrator to output the reset signal 100. Thus, only when three clocks are input, the third-step flip-flop D13 or D23 outputs "0", thereby changing the output of the AND circuit, i.e., the reset signal 100, from "1" to "0".

Figure 5:
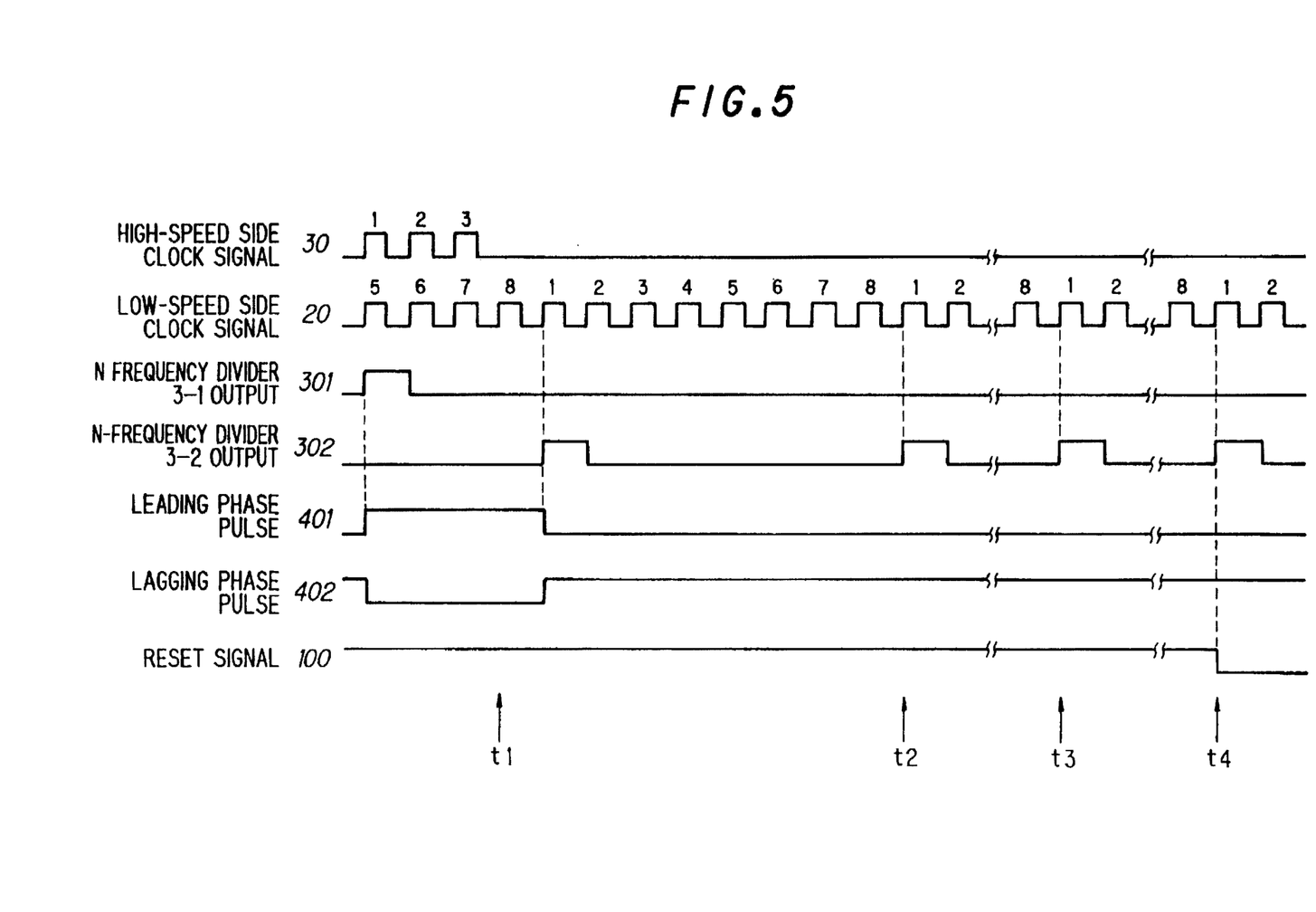
FIG. 5 shows waveforms in operation of the data receiving circuit and high-speed side clock trouble detection circuit in FIGS. 3 and 4.

With reference to FIG. 5, when the high-speed side clock signal 30 breaks down at time t1, the output 301 thereafter continuously stops and only the output 302 continues. Therefore, the leading phase pulse 401 retains a "0" and the lagging phase pulse 402 retains a "1" output. Thus, the detection circuit 10 begins to operate. Then, the output of the flip-flop D11 becomes "0" at time t2, the output of the flip-flop D12 becomes "0" at time t3 and the output of the flip-flop D13 becomes "0" at time t4. At the time t4, the reset signal 100 is changed from "1" to "0". Therefore, the random walk filters 5, 6 and detection circuit 10 are reset to output the reference clock signal as it is from the frequency regulator 1.

Here, if the high-speed side clock signal 30 is normally input, the reset signal 100 is not output with a "1" since third-step flip-flop D13 or D23 takes a DISABLE state before the output becomes "0". If necessary, the number of steps of the flip-flip may be increased or decreased, thereby changing the threshold for detection in the detection circuit 10.

As explained above, in the data receiving circuit in the embodiment, when the high-speed side clock signal 30 has trouble, the high-speed side clock trouble detection circuit 10 outputs the reset signal 100 to the primary random walk filter 5, secondary random walk filter 6 and Q counter 7 to stop the pulse control to the reference clock signal in the frequency regulator 1. Thus, since a signal(free-run frequency signal) obtained by dividing the reference clock signal as it is by R is output as the low-speed side clock signal, the trouble in the low-speed side clock signal can be prevented to correctly read out data from the memory.

Though this embodiment is concerned to an example in which DPLL is employed in a data receiving circuit, it is apparently obvious that this DPLL can be utilized for various uses.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A digital phase synchronous circuit, comprising:
   a phase comparator circuit for outputting a count value according to a phase comparison between an output signal and an externally input reference signal;
   a frequency regulator circuit for receiving an oscillation signal with a predetermined repetition frequency and controlling said repetition frequency according to said count value such that it is output as said output signal; and
   a control circuit for controlling said frequency regulator circuit such that said oscillation signal with said predetermined repetition frequency is output as said output signal when said reference signal fails.

2. The digital phase synchronous circuit of claim 1, wherein:
   said phase comparator circuit outputs a leading phase pulse when said phase comparison indicates a phase leading state and outputs a lagging phase pulse when said phase comparison indicates a phase lagging state;
   said phase comparator circuit further comprises an up-down counter responsive to said leading phase pulse and said lagging phase pulse and outputting a count value in accordance with said phase pulses; and
   said control circuit comprises a resetting circuit for resetting said count value of said up-down counter in response to the failure of said reference signal.

3. The digital phase synchronous circuit of claim 2, wherein said control circuit outputs a reset signal after a predetermined period from the failure of said reference signal, said count value of said up-down counter being reset by said reset signal.

4. A data receiving circuit, comprising:
   a phase comparator circuit for outputting a count value according to the result of a phase comparison between an output signal and an externally input reference signal;
   a frequency regulator circuit for receiving an oscillation signal with a predetermined repetition frequency and controlling said repetition frequency according to said count value such that it is output as said output signal;
   a control circuit for controlling said frequency regulator circuit such that said oscillation signal and said predetermined repetition frequency is output when said reference signal fails; and
   a memory for storing received data in accordance with said reference signal;
   wherein said received data in said memory is read out in accordance with said output signal.

5. The data receiving circuit of claim 4, wherein:
   said phase comparator circuit outputs a leading phase pulse when said phase comparison indicates a phase leading state and outputs a lagging phase pulse when said phase comparison indicates a phase lagging state;
   said phase comparator circuit further comprises an up-down counter responsive to said leading phase pulse and said lagging phase pulse and outputting a count value in accordance with said phase pulses; and
   said control circuit comprises a resetting circuit for resetting said count value of said up-down counter in response to the failure of said reference signal.

6. The data receiving circuit of claim 5, wherein said control circuit outputs a reset signal after a predetermined period from the failure of said reference signal, said count value of said up-down counter being reset by said reset signal.

7. The digital phase synchronous circuit of claim 3, wherein said control circuit further comprises:
   a first plurality of cascaded flip-flop circuits, each flip-flop circuit having a data input, a clock input, an enable input and an output;
   a second plurality of cascaded flip-flop circuits, each flip-flop circuit having a data input, a clock input, an enable input and an output; and
   an AND circuit having at least two inputs and an output, said outputs of a final flip flop circuit from each of said first and second plurality of cascaded flip-flop circuits being input to said AND circuit, said reset signal being taken from said output of said AND circuit.

8. The digital phase synchronous circuit of claim 7, wherein said leading phase pulse is coupled to said enable inputs of said first plurality of cascaded flip-flop circuits, and said lagging phase pulse is coupled to said enable inputs of said second plurality of cascaded flip-flop circuits.

9. The digital phase synchronous circuit of claim 8, wherein said output signal is coupled to said clock inputs of said first and second cascaded flip-flop circuits.

10. The digital phase synchronous circuit of claim 9, wherein:

said first and second plurality of cascaded flip-flop circuits each include an initial flip flop circuit, an intermediate flip flop circuit and said final flip flop circuit;

the data inputs of said initial flip flop circuits are coupled to a digital low.

11. The digital phase synchronous circuit of claim 10, wherein:

said output of said initial flip-flop circuit is coupled to said data input of said intermediate flip-flop circuit in said first plurality of cascaded flip-flop circuits;

said output of said initial flip-flop circuit is coupled to said data input of said intermediate flip-flop circuit in said second plurality of cascaded flip-flop circuits; and any of said outputs of said intermediate flip flop circuits are coupled to said data inputs of subsequent flip flop circuits, respectively, in said plurality of cascaded flip-flop circuits.

12. The digital phase synchronous circuit of claim 6, wherein said control circuit further comprises:

a first plurality of cascaded flip-flop circuits, each flip-flop circuit having a data input, a clock input, an enable input and an output;

a second plurality of cascaded flip-flop circuits, each flip-flop circuit having a data input, a clock input, an enable input and an output; and an AND circuit having at least two inputs and an output, said outputs of a final flip flop circuit from each of said first and second plurality of cascaded flip-flop circuits being input to said AND circuit, said reset signal being taken from said output of said AND circuit.

13. The digital phase synchronous circuit of claim 12, wherein said leading phase pulse is coupled to said enable inputs of said first plurality of cascaded flip-flop circuits, and said lagging phase pulse is coupled to said enable inputs of said second plurality of cascaded flip-flop circuits.

14. The digital phase synchronous circuit of claim 13, wherein said output signal is coupled to said clock inputs of said first and second cascaded flip-flop circuits.

15. The digital phase synchronous circuit of claim 14, wherein:

said first and second plurality of cascaded flip-flop circuits each include an initial flip flop circuit, an intermediate flip flop circuit and said final flip flop circuit;

the data inputs of said initial flip flop circuits are coupled to a digital low.

16. The digital phase synchronous circuit of claim 15, wherein:

said output of said initial flip-flop circuit is coupled to said data input of said intermediate flip-flop circuit in said first plurality of cascaded flip-flop circuits;

said output of said initial flip-flop circuit is coupled to said data input of said intermediate flip-flop circuit in said second plurality of cascaded flip-flop circuits; and any of said outputs of said intermediate flip flop circuits are coupled to said data inputs of subsequent flip flop circuits, respectively, in said plurality of cascaded flip-flop circuits.

* * * * *